United States Patent [19]

Barnard

[11] Patent Number: 4,965,853
[45] Date of Patent: Oct. 23, 1990

[54] RADIO RECEIVER CIRCUIT WITH TUNING FEEDBACK CONTROL FOR A TUNABLE BANDPASS FILTER

[75] Inventor: Michael E. Barnard, Reigate, United Kingdom

[73] Assignee: U.S. Philips Corp., New York, N.Y.

[21] Appl. No.: 414,805

[22] Filed: Sep. 29, 1989

[30] Foreign Application Priority Data

Oct. 12, 1988 [GB] United Kingdom ............... 8823879

[51] Int. Cl.[5] ............................................. H04B 1/30
[52] U.S. Cl. ................... 455/209; 455/214; 455/325; 455/339; 455/340
[58] Field of Search ............. 455/206, 207, 209, 214, 455/305, 306, 339, 340, 188, 190, 192, 315, 337, 255, 316, 317, 325, 324, 340, 333

[56] References Cited

U.S. PATENT DOCUMENTS

| | | | |
|---|---|---|---|
| 4,408,350 | 10/1983 | Donath | 455/306 |
| 4,476,583 | 10/1984 | Muterspaugh | 455/340 |
| 4,653,117 | 3/1987 | Heck | 455/209 |
| 4,718,113 | 1/1988 | Rother et al. | 455/209 |
| 4,731,877 | 3/1988 | Moon | 455/188 |
| 4,776,039 | 10/1988 | Kkaiwa | 455/209 |

FOREIGN PATENT DOCUMENTS 0027613 2/1984 Japan .

Primary Examiner—Reinhard J. Eisenzopf
Assistant Examiner—Lisa Charouel
Attorney, Agent, or Firm—Emmanuel J. Lobato

[57] ABSTRACT

A zero-IF radio receiver circuit comprises an input filter (3), quadrature mixers (9,10), d.c.-blocking capacitors (24,26) and a demodulator (22). The circuit is partly integrated on a semiconductor chip and an inductive component of the input filter comprises one or more of the chip bond-wires. In order to compensate for the inevitable variation of the inductance of these bond-wires from circuit to circuit part of the signal from the local oscillator (12) is added to the input signal before its application to the input filter and the d.c. component of the resulting output from one mixer (10), which component is representative of the phase shift of the local oscillator signal produced by the input filter and hence of any tuning error of this filter, is applied to a tuning control input (30) of the filter to reduce the error. Alternatively the tuning control signal may be adjusted to maximize the sum of the squares of the d.c. components of the signals in the two IF channels and hence minimize the attenuation produced by the input filter.

10 Claims, 4 Drawing Sheets

RADIO RECEIVER CIRCUIT WITH TUNING FEEDBACK CONTROL FOR A TUNABLE BANDPASS FILTER

BACKGROUND OF THE INVENTION

This invention relates to a radio receiver circuit comprising, in cascade, a bandpass filter for a desired received signal, a frequency translator circuit for translating the desired received signal to an intermediate frequency, and a demodulator circuit for demodulating the frequency-translated desired received signal, said frequency translator circuit comprising a local oscillator circuit and a mixer circuit to a first input of which the output of the local oscillator circuit is coupled and to a second input of which the output of the bandpass filter is coupled. The receiver circuit includes a tuning control circuit for the bandpass filter, which tuning control circuit comprises means for applying to the input of the bandpass filter a locally generated signal the frequency of which is substantially equal to that of the desired received signal and a control loop coupling an output of the frequency translator circuit to a tuning control input of the bandpass filter, for automatically tuning the bandpass filter to substantially the frequency of said locally generated signal.

One known arrangement of this general kind is disclosed in Japanese Kokai No. 59-027613. In this known arrangement the output frequency of the local oscillator circuit is variable to thereby tune the arrangement to different desired received signals, and the bandpass filter is tuned simultaneously. The purpose of the tuning control circuit is to eliminate tracking errors between the two. To ensure that the tuning control circuit operates satisfactorily even when the desired received signal is weak the input of the bandpass filter is switched temporarily from an antenna to the output of an auxiliary circuit which locally produces a "pseudo broadcast signal".

It is often an aim of electronic circuit design and deveopment to enable as much as possible of the circuit to be integrated on one or more semiconductor chips to minimize the assembly operations required to implement an operating system and/or to enable the volume occupied by the circuit to be reduced. Such chips are normally encapsulated for protective reasons, the encapsulations being provided with external conductive connectors to enable parts of the integrated circuit to be electrically accessed from the exterior, for example for power supply and signal input and output purposes. The connectors are normally conductively connected to the relevant points of the chip by so-called bond wires. One circuit element which it is not easy to implement in integrated circuit form is an inductor, and this has led to inductance being simulated by such things as capacitively terminated gyrator circuits. However these circuits themselves are impracticable when they are required to operate at frequencies in the order of, for example, $10^8$ or $10^9$ Hz, which frequencies are becoming increasingly of interest for radio purposes. Thus, for example, the inductive component of an RF bandpass filter for a radio receiver operating in a frequency band in the $10^8$ or $10^9$ Hz range has normally to be implemented as a discrete inductor, which fact is on the face of it in conflict with the above-mentioned aims of minimizing the number of assembly operations required to implement an operating system and/or enabling the volume occupied by the circuit to be reduced. It is an object of the present invention to mitigate this problem.

SUMMARY OF THE INVENTION

The invention provides a circuit as defined in the first paragraph which is characterised in that the intermediate frequency is substantially zero, the means for applying a locally generated signal to the input of the bandpass filter comprises a coupling from an output of the local oscillator circuit to the input of the bandpass filter, part of the circuit is integrated on an encapsulated semiconductor chip, and the bandpass filter includes an inductor which is present as a discrete component encapsulated together with the chip.

It has now been recognised that if a circuit as defined in the first paragraph is of the so-called zero IF type and part of it is constructed in integrated circuit form it becomes practicable to form an inductive component of the bandpass filter as a discrete inductor which is encapsulated together with the integrated circuit, the tuning control circuit compensating for the inevitable variations in the value of the inductor from one particular circuit to another and thereby ensuring that the tuning of the filter is always substantially correct. In a (substantially) zero IF receiver which includes a frequency translator circuit of the kind specified, the operating frequency of the local oscillator is substantially equal to the frequency of the desired received signal and therefore may be used as a reference frequency for the tuning control loop. The enables the control loop to operate satisfactorily even when the amplitude of the received carrier is so low that the carrier is masked by noise, as may be the case if, for example, the desired received signal is of the so-called "spread spectrum" kind. In contrast to the arrangement disclosed in the previously discussed Japanese Kokai No. 59-027613, in the circuit according to the present invention the control loop may be arranged to be continuously operational during the operating periods of the circuit because the signal supplied by the local oscillator circuit to the filter will be translated by the frequency translator circuit to the filter will be translated by the frequency translator circuit to d.c. Zero IF receivers normally include d.c.-blocking means prior to the demodulator circuit to remove d.c. offsets which inevitably occur, which means will therefore block the frequency-translated local oscillator signal and therefore prevent it from interfering with the frequency-translated desired signal presented to the demodulator. Obviously the input signal of the control loop will have to be taken off prior to the d.c.-blocking means.

If the required value of the inductor is appropriate the inductor may comprise a bond wire connected to the chip.

The oscillator signal is applied to the second input of the mixer circuit via the bandpass filter and also to the first input of the mixer circuit. The d.c. component of the mixer circuit output is therefore dependent upon both the relative phases of the two signals so applied and to their amplitudes. As is known, the phase shift produced by a bandpass filter is dependent upon the difference (if any) between the center frequency of the passband and the frequency of the signal transmitted through the filter, being normally zero if the difference is zero and otherwise having a sign determined by the sign of the difference. Thus the relative phases are themselves representative of the degree and direction of mistuning (if any) of the filter. The control loop may comprise means for deriving from an output of the frequency translator circuit a tuning control signal which is representative of the phase of the oscillator signal applied to the second input of the mixer circuit via the bandpass filter relative to the phase of the local oscillator signal applied to the first input of the mixer circuit, and applying said tuning control signal to said tuning control signal input. If a 90° phase-shifter is provided at one of the mixer circuit inputs then the resulting mixer circuit/phase-shifter combination will act directly as a detector for said relative phases, with the result that the d.c. component of its output signal may, after phase inversion and/or amplification if required, be used directly for application to the tuning control signal input.

As an alternative to using the phase-shift produced by the filter to generate the requisite tuning control signal use may be made of the fact that the attenuation of a signal transmitted by the filter will be a minimum when the frequency of the signal is equal to the center-frequency of the filter passband. To this end the control loop may, as an alternative, comprise means for deriving from an output of the frequency translator circuit a signal which is representative of the attenuation of the oscillator signal by the bandpass filter and is independent of the phase of the oscillator signal applied to the second input of the mixer circuit via the bandpass filter relative to the phase of the oscillator signal applied to the first input of the mixer circuit, means for applying a periodically varying tuning control signal to said tuning control signal input, and means for controlling the direction of each variation of the tuning control signal in dependence on the direction of any variation of the attenuation-representative signal arising from the preceding variation of the tuning control signal to thereby minimize said attenuation. Zero-IF receivers often employ a pair of quadrature-related mixers in their frequency translator circuits, giving rise to a pair of quadrature-related zero-IF channels. If this is the case the attenuation-representative phase-independent signal may be produced by squaring the values of the d.c. components of the signals in the two channels and adding together the results.

BRIEF DESCRIPTION OF THE DRAWING

Embodiments of the invention will now be described, by way of example, with reference to the accompanying diagrammatic drawings, in which.

DETAILED DESCRIPTION OF THE INVENTION

Figure 1:
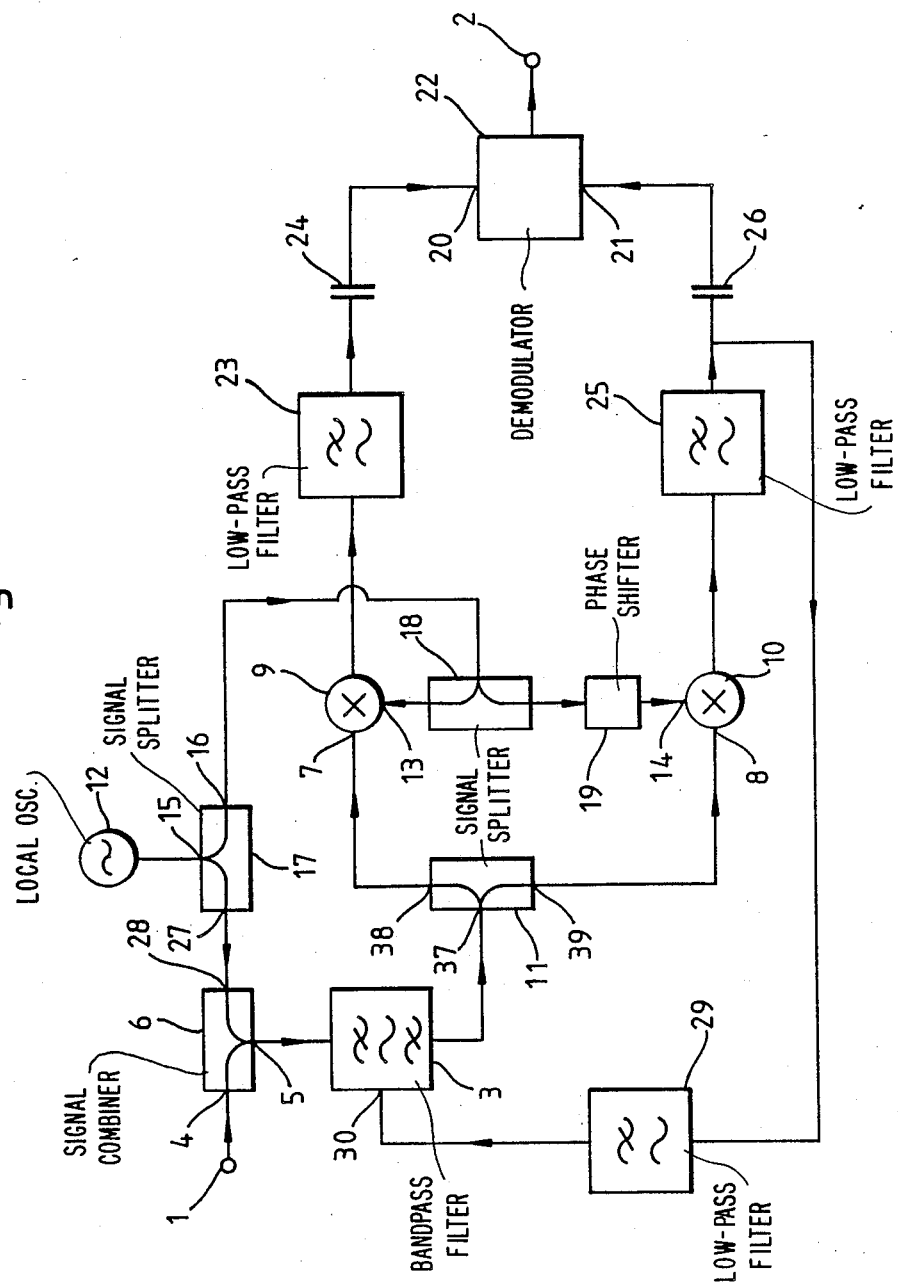
FIG. 1 is the circuit diagram of a first embodiment.

In FIG. 1 a radio receiver circuit has an input 1 for connection to an antenna and an output 2 for a demodulated desired received signal. The input 1 is coupled to a bandpass input filter 3 via one input 4 and the output 5 of a signal combining means 6. The output signal of filter 3 is fed to first inputs 7 and 8 of multiplicative mixers 9 and 10 respectively via the input 37 and the outputs 38 and 39 respectively of a signal splitter 11. The output signal of a local oscillator circuit 12 is fed to second inputs 13 and 14 of the mixers 9 and 10 respectively via the input 15 and one output 16 of a signal splitter 17, and a signal splitter 18, a 90° phase shifter 19 being included in the signal path to mixer input 14. The output signals of the mixers 9 and 10 are fed to inputs 20 and 21 respectively of a demodulator circuit 22 via a low-pass filter 23 and a d.c.-blocking capacitor 24, and via a low-pass filter 25 and a d.c.-blocking capacitor 26, respectively. The output of demodulator circuit 22 constitutes the output 2. Bandpass input filter 3 is tuned to the frequency of a desired signal received at input 1 and the output frequency of local oscillator circuit 12 is selected to be substantially equal to this frequency, so that the desired signal is translated to an intermediate frequency of substantially zero by the (quadrature) mixers 9 and 10.

The part of the receiver described so far, other than the signal splitter 17 and the signal combiner 6, constitutes a conventional zero-IF radio receiver, the frequency-translated desired received signal being filtered by the filters 23 and 25 and demodulated by demodulator 22 after any d.c. components thereof have been removed by the capacitors 24 and 26. Suitable constructions for demodulator 22 are well-known, the particular construction adopted being determined by, inter alia, the type of modulation employed in the desired received signal.

The output signal of local oscillator circuit 12 is also coupled to the input of filter 3 via an output 27 of splitter 17 and an input 28 of combiner 6, and is therefore also transmitted to the inputs 7 and 8 of the mixers 9 and 10. (Multiplicative) mixers 9 and 10 translate this component of their input signals to zero frequency and, because of the presence of 90° phase-shifter 19, mixer 10 actually operates as a phase-detector for this component of its input signal. Provided, therefore, that the amplitude of any signal of the same frequency transmitted to mixer input 8 from the input 1 is negligible compared with the amplitude of this component (as can be easily arranged to be the case if, for example, the desired received signal is of a suppressed carrier or spread spectrum type) the sign and magnitude of the d.c. component of the output signal of filter 25 will be a measure of the degree and sense of any deviation of the phase of the said component of the input signal of mixer 10 from the phase of the local oscillator signal applied to phase shifter 19. This d.c. component (if any) is filtered further by means of a low-pass control loop filter 29 and applied to a tuning control signal input 30 of the input filter 3.

As is known, the phase-shift produced by an elementary bandpass filter changes from positive to negative with changes in the frequency of an input signal thereto from one side of the center-frequency of its passband to the other side, the phase shift being zero at the center-frequency. This fact is used in the circuit of FIG. 1 to achieve automatic tuning of the filter 3, in that it results in the phase of the signal from oscillator circuit 12 transmitted by filter 3 being dependent on the relationship of the frequency of said signal to the center-frequency of the response characteristic of filter 3, and hence in the d.c. component transmitted by filter 29 being representative of said relationship. This component is applied to the tuning control signal input 30 and adjusts the center-frequency in a sense such as to reduce any deviation thereof from the output frequency of local oscillator 12 and therefore to automatically adjust said center-frequency to be substantially equal to the frequency of the desired signal received on input terminal 1. (It should be noted that so-called tracking filters in which a signal is applied to one input of a phase detector directly and to the other input after passage through a filter, the resulting output signal of the phase detector being used to tune the filter to the frequency of the signal, are known per se, for example from GB-A-2044026).

Figure 2:
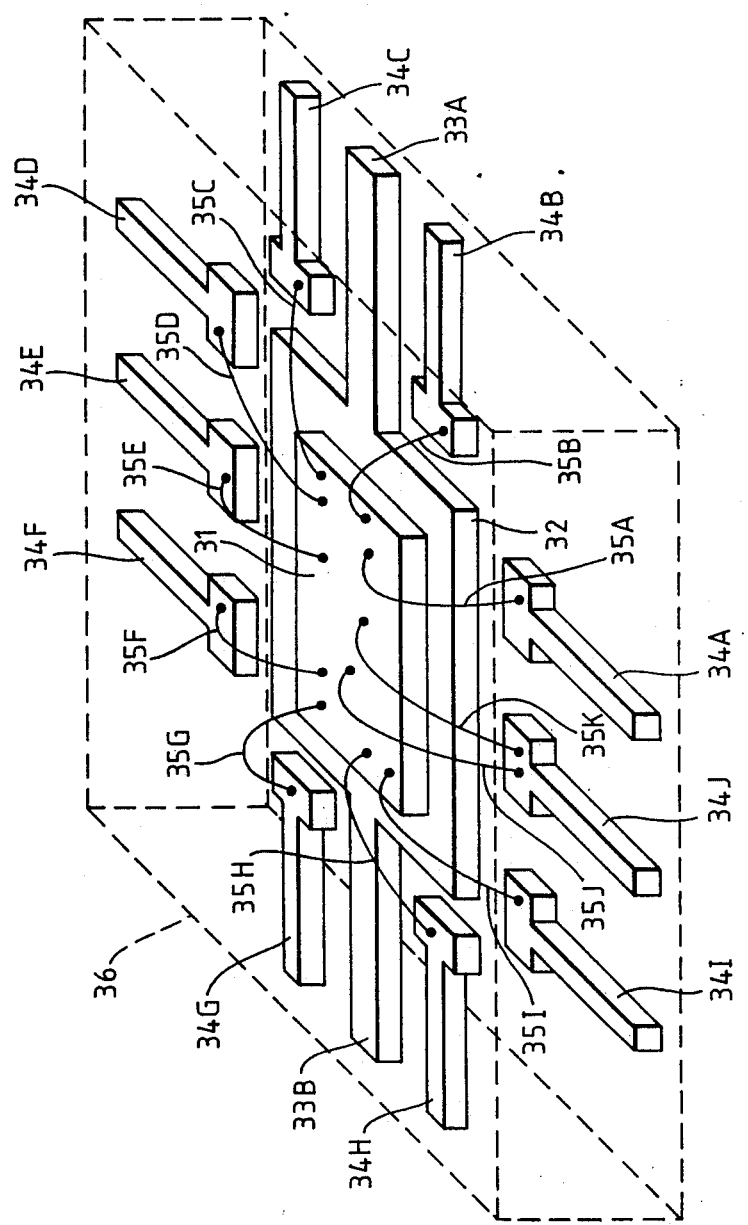
FIG. 2 is a perspective view of a practical construction of the circuit of FIG. 1 in encapsulated integrated circuit form.

In practice, whereas at least an inductive component of the filter 30 is present as a discrete component, at least part of the remainder of the arrangement of FIG. 1 is integrated in a manner known per se on a semiconductor chip. Such a chip is shown diagrammatically at 31 in FIG. 2 and, in FIG. 2, is mounted in a conventional manner on a metal plate 32 provided with a pair of extensions 33A and 33B. The extensions 33 provide support during manufacture as, during this time, they form part of a lead frame which also includes leads 34A-34J which in general provide electrically conductive connections to the exterior for various points of the circuit integrated on the chip. (The extensions 33 can provide connections to the exterior for the back of the chip 31, if required). To this end the relevant areas of the chip are connected to the relevant leads 34 via conventional so-called "bond wires" 35A-35K. It will be noted that two of these bond wires, 35J and 35K respectively, are connected to the same lead 34J. The complete assembly other than the projecting parts of the extensions 33 and the leads 34 are enclosed in conventional manner in a protective encapsulation 36 (shown in dashed lines), for example by means of an injection moulding technique.

Figure 3:
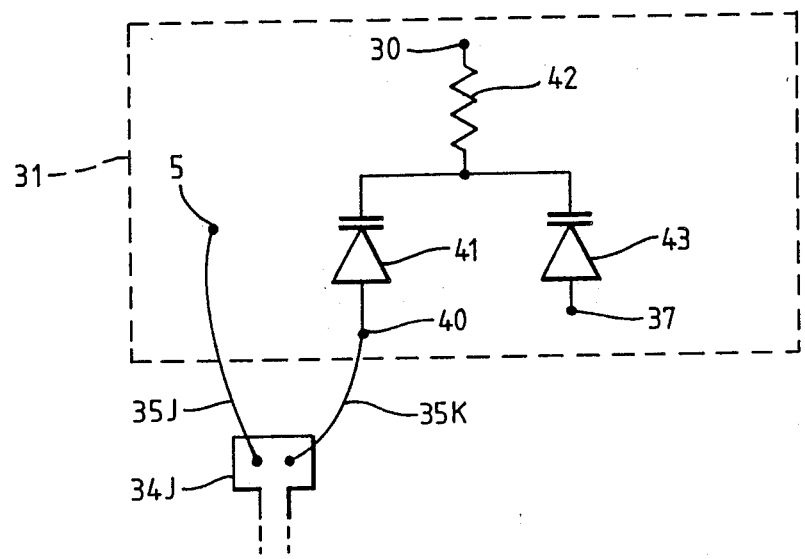
FIG. 3 illustrates a first possible practical construction for one of the blocks of FIG. 1.

The two bond wires 35J and 35K connected to the lead 34K in fact constitute an inductive component or inductive components of the input filter 3 of FIG. 1. FIG. 3 shows in diagrammatic form one way in which this can be achieved.

As will be seen from FIG. 3 the point of the integrated circuit 31 to which wire 35J is bonded corresponds to the output 5 of signal combiner 6 of FIG. 1, and wire 35K is bonded to a point 40 of circuit 31 which corresponds to the anode of a variable capacitance diode 41 integrated on the chip 31. The cathode of diode 41 is connected within the integrated circuit both via an (integrated) resistor 42 to the point 30, i.e. to the point of the integrated circuit which constitutes the tuning control input of the filter 3, and also to the cathode of a second variable capacitance diode 43 also integrated on the chip 31. The anode of diode 43 is connected within the integrated circuit to the point of the circuit which constitutes the input 37 of the signal splitter 11 of FIG. 1. It is assumed for the purposes of FIG. 3 that the control signal supplied to the tuning control input 30 is always positive, so that the diodes 41 and 43 are always reverse-biased. (Conventional constructions for the mixers 9 and 10 of FIG. 1 will have a differential output, and this may be converted to a signal which is always positive by including a conventional differential-to-single-ended converter (not shown) somewhere in the signal path from the output of mixer 10 to the tuning control input 30).

Because the bond wires 35J and 35K of FIG. 3 each exhibit a finite inductance, which inductances are connected in series, these wires together with the series-connected variable capacitance diodes 41 and 43 form a series-resonant circuit connected between the points 5 and 37. Thus, in effect, a bandpass filter is present between the points 5 and 37 as required, the center-frequency of the pass characteristic being variable by varying the capacitances of the diodes 41 and 43 by means of the control signal applied to point 30. If the inductances of the wires 35J and 35K and L1 and L2 respectively, and the capacitances of the diodes 41 and 43 are C1 and C2 respectively, it can be shown that, if any parasitic impedances also present are neglected, the impedance between points 5 and 37 is given by $[(C1+C2)-w^2 C_1 C_2 (L1+L2)]/jwC1C2$. Thus the filter center-frequency is given by $w^2=(C1+C2)/(L1+L2)C1C2$, from which it can be seen that the center-frequency decreases with increasing C1 and C2, i.e. with decreasing values of the control voltage applied to control input 30.

Figure 4:
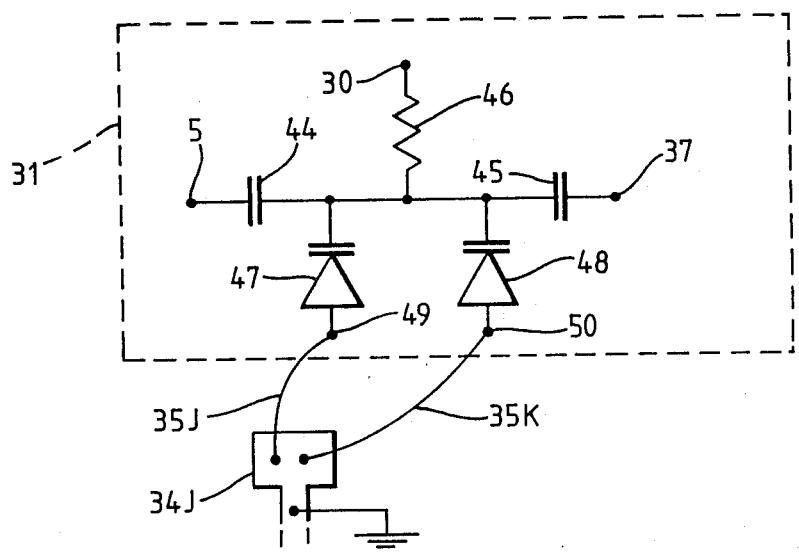
FIG. 4 illustrates a second possible practical construction for the said one of the blocks of FIG. 1.

FIG. 4 shows in diagrammatic form a second way in which it can be achieved that the two bond wires 35J and 35K of FIG. 2 constitute an inductive component or inductive components of the input filter 3 of FIG. 1. Here the points 5 and 37 of the circuit 31, corresponding to the output of combiner 6 and the input of splitter 11 respectively of FIG. 1, are interconnected by a pair of series-connected capacitors 44,45 also integrated on the chip, the common point of these capacitors being connected to the point of the circuit corresponding to the tuning control signal input 30 of the input filter 3 of FIG. 1 via a resistor 46 also integrated on the chip. Said common point is also connected to the cathodes of a pair of variable capacitance diodes 47,48 also integrated on the chip. The wires 35J and 35K are bonded to points 49 and 50 respectively of the chip, which points correspond to the anodes of the diodes 47 and 48 respectively. In the arrangement of FIG. 4 the lead 34J is connected to ground.

Because wires 35J and 35K each exhibit a finite inductance the components 47 and 35J constitute a series-resonant circuit, as do the components 48 and 35K, these resonant circuits being connected in parallel. Again, if the inductances of the wires 35J and 35K are L1 and L2 respectively, and the capacitances of the capacitors 47 and 48 are C1 and C2 respectively, and any parasitic impedances are neglected, the impedance between the common point of the capacitors 44 and 45 and ground is given by $$(1-w^2 L1C1)(1-w^2 L2C2)/[jwC1(1-w^2 L2C2)+jw-C2(1-w^2 L1C1)]$$

This impedance is a maximum if $w^2=0$ or $(C1+C2)/(L1+L2)C1C2$ and a minimum if $w^2=1/L1C1$ or $1/L2C2$. Thus the circuit detailed in FIG. 4 has a frequency characteristic between points 5 and 37 which exhibits one pole and two zeros (neglecting the zero at w=0 produced by the series capacitors 44 and 45), the center frequency of the pass characteristic being given by $w^2=(C1+C2)/(L1+L2)C1C2$, i.e. the same expression as is obtained for the filter of FIG. 3. This center frequency can be varied by varying the reverse bias applied to diodes 47 and 48 through point 30, similarly to the arrangement of FIG. 3.

It is not essential that the discrete inductive components of the filter 3 of FIG. 1 be constituted by so-called bond wires; obviously this is only appropriate where the inductances of the bond wires are in the order of that required. Alternatively these components may be present in another appropriate form. In this connection reference may be made to e.g. GB-A-2160707 and WO- A-85/04521 the disclosures of which relate to packages comprising integrated circuits and associated discrete components.

Although in the arrangements described so far the tuning control signal for the input filter 3 is in effect the d.c. component of the output signal of mixer 10 (possibly after amplification and/or conversion by the aforementioned differential-to-single-ended converter) the magnitude and sign of this d.c. component being directly representative of the magnitude and sign of any difference between the center-frequency of the filter bandpass characteristic and the output frequency of oscillator 12, the tuning control signal may be derived in another way. Thus, for example, the fact may be utilised that the attenuation of the oscillator output signal by filter 3 will be a minimum when the filter bandpass characteristic center frequency coincides with the output frequency of oscillator 12, the filter 3 therefore being tuned in a dynamic manner until the amplitudes of the signals in the two quadrature channels are a maximum. One way in which this can be done will now be described with reference to FIGS. 5 and 6 of the drawings.

Figure 5:
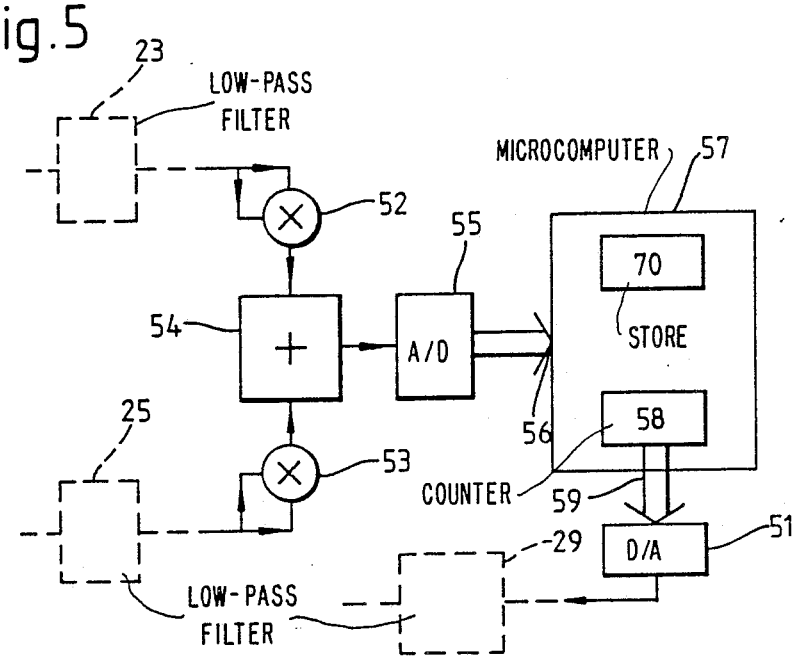
FIG. 5 shows a possible modification to part of the circuit of FIG. 1.

FIG. 5 illustrates a modification to the arrangement of FIG. 1 in which the input of loop filter 29 is removed from the output of filter 25 and connected instead to the output of a digital-to-analog converter 51. The outputs of the IF low-pass filters 23 and 25 are now connected (in addition to the d.c. blocking capacitors 24 and 26 respectively) to amplitude-squarers 52 and 53 respectively. As shown, the squarers 52 and 53 may take the form of multipliers, the output filter 23 being connected to both inputs of multiplier 52 and the output of filter 25 being connected to both inputs of multiplier 53. The output signals of multipliers 52 and 53 are added together in an adding circuit 54 and the result is converted to digital form by an analog-to-digital converter 55. (The squaring circuits 52 and 53 are provided so that the output signal of adder 54 will be independent of the phase shift produced by input filter 3, and hence be truly representative of the attenuation or otherwise of the output signal of oscillator 12 produced by filter 3). The output of converter 55 is connected to a parallel input port 56 of an appropriately programmed microcomputer or sequencer 57 which includes a counter 58 and a storage location 70. The parallel output of counter 58 is connected, via a parallel output port 59 of microcomputer or sequencer 57 to the input of converter 51.

Figure 6:
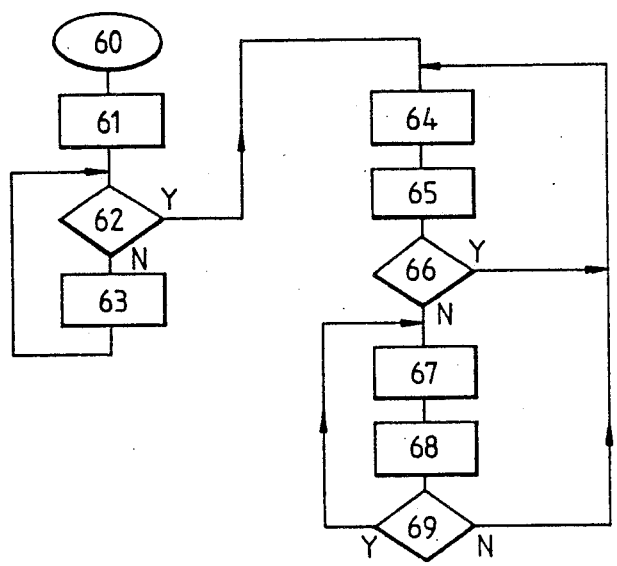
FIG. 6 is a flow chart indicating steps performed by the modification of FIG. 5.

Microcomputer or sequencer 57 is programmed to perform the operations indicated by the flow chart of FIG. 6, in which the various blocks have the following significances.

60 - Start.
61 - Set content C of counter 58 to zero. (C:=0).
62 - Is output D of converter 55 greater than a predetermined amount T? (D>T?).
63 - Increment counter 58 (C:=C+1).
64 - Set content A of storage location 70 to equal the current value of the output of converter 55. (A:=D).
65 - Increment counter 58. (C:=C+1).
66 - Is output of converter 55 greater than the current content of storage location 70? (D>A?).
67 - Set content of storage location 70 to equal the current value of the output of converter 55. (A:=D).
68 - Decrement counter 58. (C:=C−1).
69 - Is output of converter 55 greater than the current content of storage location 70? (D>A?).

Thus, after start at 60, counter 58 is set to zero, thereby causing the minimum tuning voltage to be applied to varicaps 41 and 43 of FIG. 3 or varicaps 47 and 48 of FIG. 4. It is then tested in step 62 whether the amplitude of the IF signal exceeds a specific threshold. If it does not, counter 58 is incremented in step 63, thereby increasing the tuning voltage, and test 62 is repeated. This process is continued until the amplitude of the IF signal does indeed exceed the threshold, at which point filter 3 has become tuned to a frequency approaching the output frequency of oscillator 12. Counter 58 is then incremented further, thereby further increasing the tuning voltage, by means of steps 64–66, until it is determined in test 66 that the amplitude of the IF is no longer increasing, at which point the tuning voltage is reduced once again by means of steps 67–69. When test 69 determines that the decrease in tuning voltage no longer results in an increase in IF signal amplitude a return is made to step 64, and so on. The tuning voltage therefore now oscillates about the desired value; the magnitude of these oscillations can be kept low by suitably choosing the frequency with which the loops 64–66 and 67–69 are repeated, and the cut-off frequency of filter 29. The microcomputer or sequencer 57 may, for example, be integrated on the chip 31 of FIG. 2 and may be arranged to also perform other operations, if desired.

It will be evident to those skilled in the art that many modifications may be made to the embodiments described within the scope of the invention as defined by the claims. For example, the filter 3 of FIG. 1 may take forms other than those illustrated with reference to FIGS. 3 and 4. Thus, for example, the bond wire 35K and associated variable capacitance diode 48 of FIG. 4 may be omitted, the diode 47 being replaced by a pair of back-to-back connected diodes with their common point supplied from resistor 46. Amplifiers and other components may be included in the various signal paths in the arrangement of FIG. 1 (taking care always that the phase of the signal applied to tuning control signal input 30 is such as to tune the filter 3 towards the output frequency of oscillator 12 rather than away therefrom). The arrangement may, of course, employ a single IF channel rather than a pair of quadrature channels. The mounting and encapsulation of the chip 31 may be achieved in a manner other than that described with reference to FIG. 2, alternative ways of mounting and making connections to semiconductor chips being well-known in the art.

From reading the present disclosure, other modifications will be apparent to persons skilled in the art. Such modifications may involve other features which are already known in the design, manufacture and use of receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A radio receiver circuit comprising, in cascade, a bandpass filter for a desired received signal, a frequency translator circuit for translating the desired received signal to an intermediate frequency, and a demodulator circuit for demodulating the frequency-translated desired received signal, said frequency translator circuit comprising a local oscillator circuit and a mixer circuit to a first input of which the output of the local oscillator circuit is coupled and to a second input of which the output of the bandpass filter is coupled, the arrangement including a tuning control circuit for the bandpass filter, which tuning control circuit comprises means for applying to the input of the bandpass filter a locally generated signal the frequency of which is substantially equal to that of the desired received signal and a control loop coupling an output of the frequency translator circuit to a tuning control input of the bandpass filter, for automatically tuning the bandpass filter to substantially the frequency of said locally generated signal, characterised in that the intermediate frequency is substantially zero, the means for applying a locally generated signal to the input of the bandpass filter comprises a coupling from an output of the local oscillator circuit to the input of the bandpass filter, at least a portion of the bandpass filter is integrated on an encapsulated semiconductor chip, and the bandpass filter includes an inductor which is present as a discrete component encapsulated together with the chip.

2. A radio receiver circuit as claimed in claim 1, wherein the inductor comprises a bond wire connected to the chip.

3. A radio receiver circuit as claimed in claim 1, wherein the control loop is arranged to be continuously operative during the operating periods of the arrangement.

4. A radio receiver circuit as claimed in claim 1, wherein the control loop comprises means for deriving from an output of the frequency translator circuit a tuning control signal which is representative of the phase of the oscillator signal applied to the second input of the mixer circuit via the bandpass filter relative to the phase of the local oscillator signal applied to the first input of the mixer circuit, and applying said tuning control signal to said tuning control signal input.

5. A radio receiver circuit as claimed in claim 1, wherein the control loop comprises means for deriving from an output of the frequency translator circuit a signal which is representative of the attenuation of the oscillator signal by the bandpass filter and is independent of the phase of the oscillator signal applied to the second input of the mixer circuit via the bandpass filter relative to the phase of the oscillator signal applied to the first input of the mixer circuit, means for applying a periodically varying tuning control signal to said tuning control signal input, and means for controlling the direction of each variation of the tuning control signal in dependence on the direction of any variation of the attenuation-representative signal arising from the preceding variation of the tuning control signal to thereby minimize said attentuation.

6. A radio receiver circuit, comprising:
   a tunable bandpass filter responsive to a tuning control signal for passing signals within a pass band having a center frequency to which the receiver circuit is tuned determined by the tuning control signal;
   a local oscillator for generating a local oscillator signal having a frequency equal to the frequency to which the radio receiver is tuned;
   means for applying a receiver input signal and the local oscillator signal to said tunable bandpass filter;
   first and second mixer circuits;
   means for applying the output signal of said tunable band pass filter to said first and said second mixer circuits;
   a phase shifter;
   means for applying the local oscillator signal to a first of said mixer circuits and to said phase shifter;
   said phase shifter applying the phase-shifted local oscillator signal to the second of said mixer circuits whereby said second mixer circuit develops an output signal representative of the relationship of the local oscillator signal frequency and the bandpass filter center frequency;
   tuning control signal generating means responsive to the output signal of said second mixer circuit for generating and for applying the tuning control signal to said band pass filter effective to tune said bandpass filter to the frequency of the local oscillator signal; and
   a demodulator receptive of the output signals from said first and said second mixers for demodulating the mixer output signals.

7. A radio receiver circuit according to claim 6, wherein said bandpass filter is comprised of an encapsulated integrated circuit including a discrete inductor encapsulated therewith.

8. A radio receiver circuit according to claim 7, wherein said encapsulated integrated circuit is comprised of
   a semiconductor chip,
   a plurality of leads,
   bond wires connected to define conductive paths between respective ones of said leads and said semiconductor chip, and
   means for encapsulating said semiconductor chip, portions of said leads and said bond wires, and wherein said discrete inductor is comprised of a bond wire.

9. A radio receiver circuit according to claim 6, wherein said means for generating the tuning control signal is comprised of a low pass filter connected to receive the output of said second mixer and apply the filtered mixer output as the tuning control signal to said tunable filter.

10. A radio receiver circuit according to claim 6, wherein said tuning control signal generating means for generating the tuning control signal further comprises
   a first squaring circuit connected for squaring the output of said first mixer circuit;
   a second squaring circuit connected for squaring the output of said second mixer circuit;
   an adder circuit for adding the respective outputs of said first and second squaring circuits; and
   means responsive to the adder circuit output signal for generating the tuning control signal to minimize the attenuation of said bandpass filter at the frequency of said local oscillator signal.

* * * * *